United States Patent
Osanai et al.

(10) Patent No.: US 7,667,317 B2
(45) Date of Patent: Feb. 23, 2010

(54) SEMICONDUCTOR PACKAGE WITH BYPASS CAPACITOR

(75) Inventors: Fumiyuki Osanai, Tokyo (JP); Atsushi Hiraishi, Tokyo (JP); Toshio Sugano, Tokyo (JP); Tsuyoshi Tomoyama, Tokyo (JP); Satoshi Isa, Tokyo (JP); Masahiro Yamaguchi, Tokyo (JP); Masanori Shibamoto, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 11/802,888

(22) Filed: May 25, 2007

(65) Prior Publication Data

US 2007/0273021 A1     Nov. 29, 2007

(30) Foreign Application Priority Data

May 29, 2006     (JP)     ............... 2006-148474

(51) Int. Cl.
*H01L 23/055* (2006.01)
(52) U.S. Cl. ............... 257/698; 257/688; 257/692; 257/690; 257/693
(58) Field of Classification Search ......... 257/686, 257/688, 690, 692, 693, 695
See application file for complete search history.

(56) References Cited

U.S. PATENT DOCUMENTS

| | | | |
|---|---|---|---|
| 6,365,962 B1 * | 4/2002 | Liang et al. | ............ 257/668 |
| 6,384,476 B2 | 5/2002 | Takeuchi | |
| 6,787,916 B2 * | 9/2004 | Halahan | ............ 257/777 |
| 6,867,502 B2 | 3/2005 | Katagiri et al. | |
| 2002/0008314 A1 | 1/2002 | Takeuchi | |
| 2003/0173676 A1 | 9/2003 | Horikawa | |
| 2004/0036157 A1 * | 2/2004 | Akram et al. | ............ 257/690 |

FOREIGN PATENT DOCUMENTS

| | | |
|---|---|---|
| JP | 6-005771 | 1/1994 |
| JP | 09-260537 | 10/1997 |
| JP | 10-294335 | 11/1998 |
| JP | 2000-307005 A | 11/2000 |
| JP | 2002-118197 A | 4/2002 |
| JP | 2003-264253 A | 9/2003 |

* cited by examiner

*Primary Examiner*—Marcos D. Pizarro
*Assistant Examiner*—Eva Yan Montalvo
(74) *Attorney, Agent, or Firm*—Foley & Lardner LLP

(57) ABSTRACT

A semiconductor package comprises a substrate, which has two surfaces and comprises first and second electrical paths. On one of the surfaces, a semiconductor chip is mounted. The semiconductor chip comprises a plurality of pads, which include a first pad to be supplied with a power supply and a second pad to be grounded. On the other surface, at least one bypass capacitor is mounted. The bypass capacitor comprises first and second terminals, which are connected to the first and the second pads through the first and the second electrical paths, respectively.

17 Claims, 9 Drawing Sheets

FIG. 8
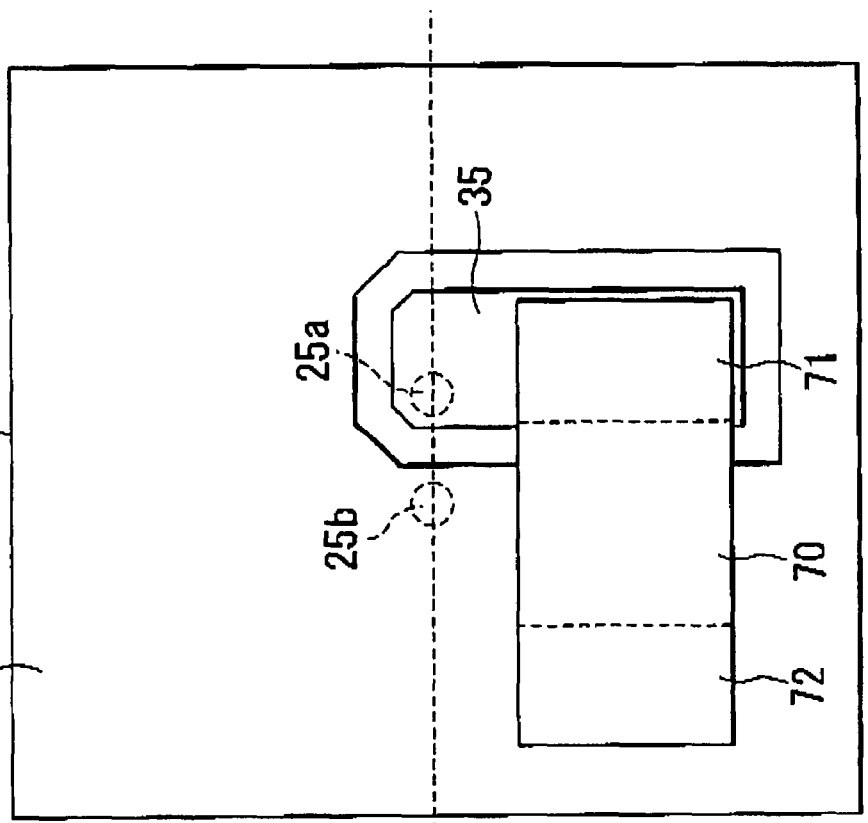
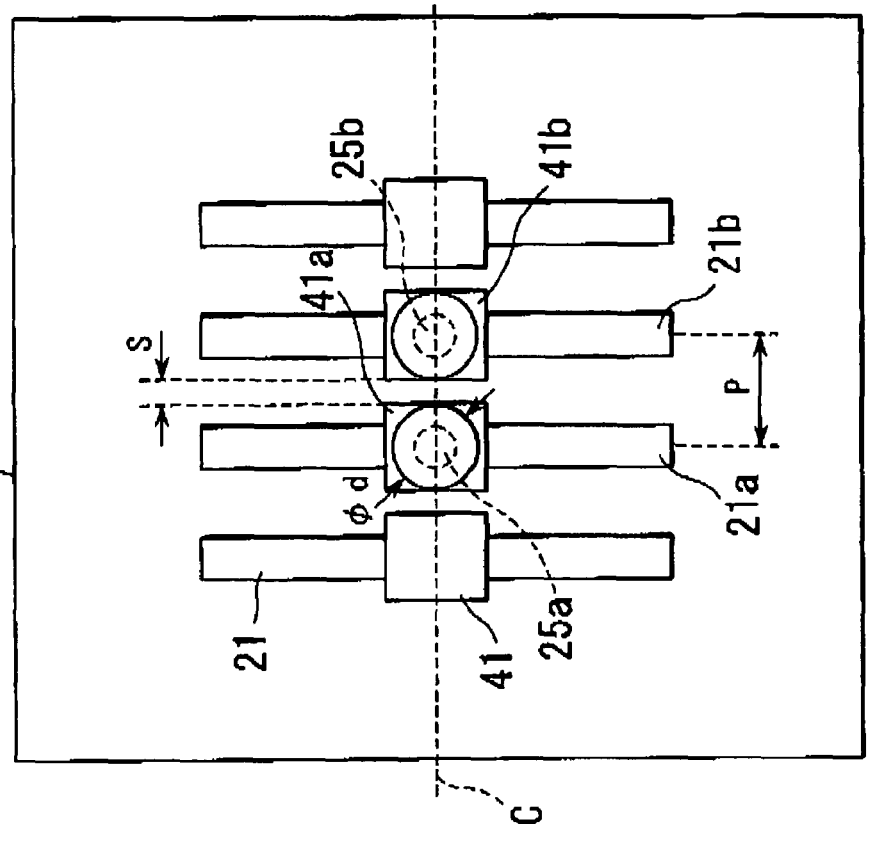

SEMICONDUCTOR PACKAGE WITH BYPASS CAPACITOR

BACKGROUND OF THE INVENTION

This invention relates to a semiconductor device including a semiconductor package and, in particular, to a technique for ensuring suitable margins for power supply and ground in the semiconductor package.

Over the past several years, operating speed of integrated circuits has increased. A semiconductor package with high-speed integrated circuits requires a stable voltage, i.e. suppression of power supply/ground voltage level fluctuation.

To suppress power supply/ground voltage level fluctuation, one of known semiconductor packages comprises bypass capacitors or decoupling capacitors, which can reduce impedance between the power supply and the ground For example, JP-A H6-5771 discloses a semiconductor package including such decoupling capacitors, the contents of JP-A H6-5771 being incorporated herein by reference in their entireties.

SUMMARY OF THE INVENTION

It is an object of the present invention to provide a semiconductor package which can effectively suppress power supply/ground voltage level fluctuation by the use of at least one bypass capacitor.

According to one aspect of the present invention, a semiconductor package comprises a substrate, which has upper and lower surfaces and comprises first and second electrical paths. On the upper surface, a semiconductor chip is mounted. The semiconductor chip comprises a plurality of pads, which include a first pad to be supplied with a power supply and a second pad to be grounded. On the lower surface, at least one bypass capacitor is mounted on the lower surface. The bypass capacitor comprises first and second terminals, which are connected to the first and the second pads through the first and the second electrical paths, respectively.

With the above-mentioned structure, the bypass capacitor may be arranged as close as to the first and the second pads of the semiconductor chip so that effective suppression of voltage level fluctuation can be expected.

An appreciation of the objectives of the present invention and a more complete understanding of its structure may be had by studying the following description of the preferred embodiment and by referring to the accompanying drawings.

BRIEF DESCRIPTION OF THE DRAWINGS

FIG. 8 is a set of partial, enlarged views concerning another modification of the substrate of FIG. 4.

Figure 1:
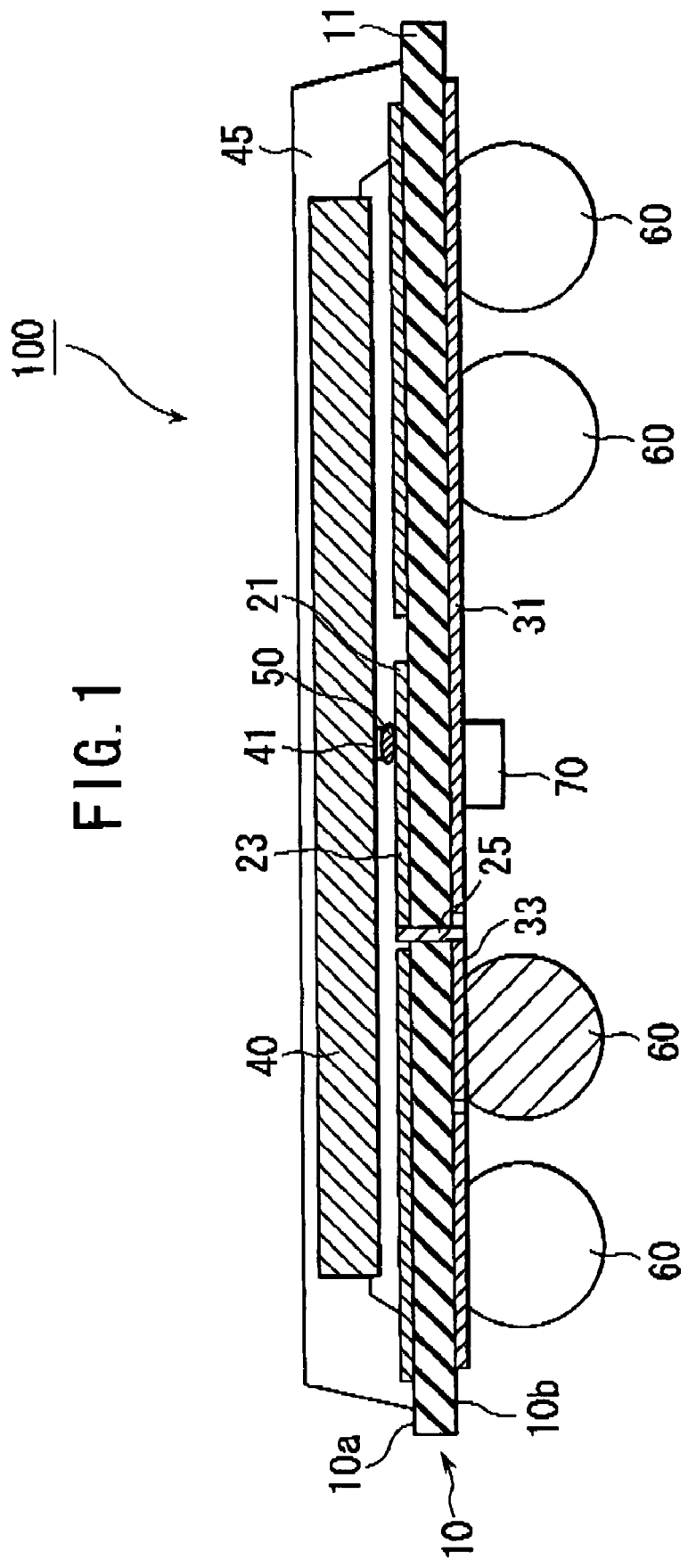
FIG. 1 is a cross-sectional view showing a semiconductor package in accordance with a preferred embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIG. 1, a semiconductor package 100 according to a preferred embodiment of the present invention is a flip chip ball grid array (FCBGA) package. For example, one of FCBGA packages is disclosed in U.S. Pat. No. 6,867,502 B2, which is incorporated herein by reference in its entirety. The FCBGA package 100 of the present embodiment comprises a two metal layer substrate 10. The substrate 10 comprises a flexible polyimide tape as a base member 11 and has upper and lower surfaces 10a and 10b.

Figure 3:
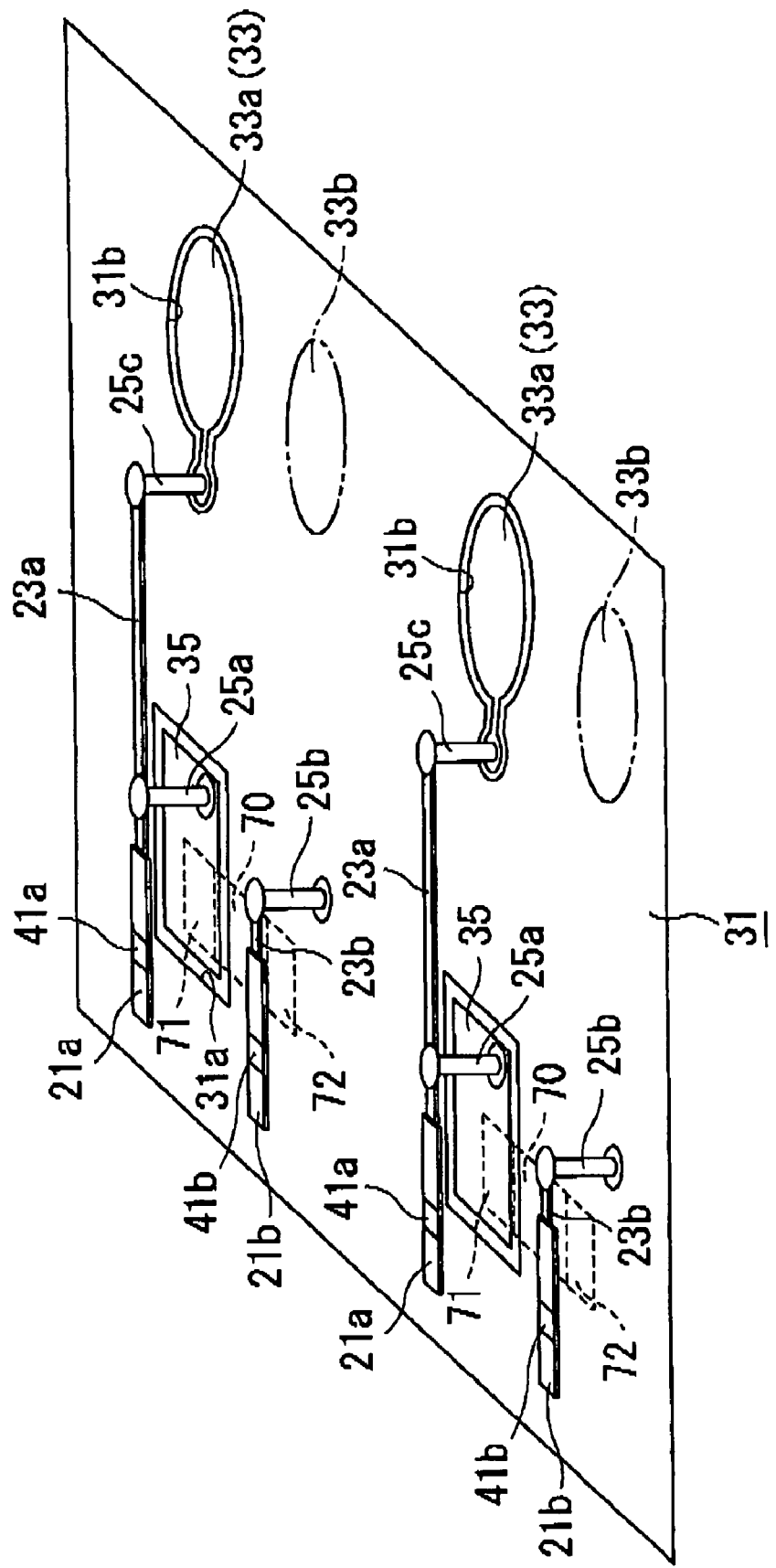
FIG. 3 is a partial, perspective view schematically showing electrical paths in the semiconductor package of FIG. 1.
Figure 4:
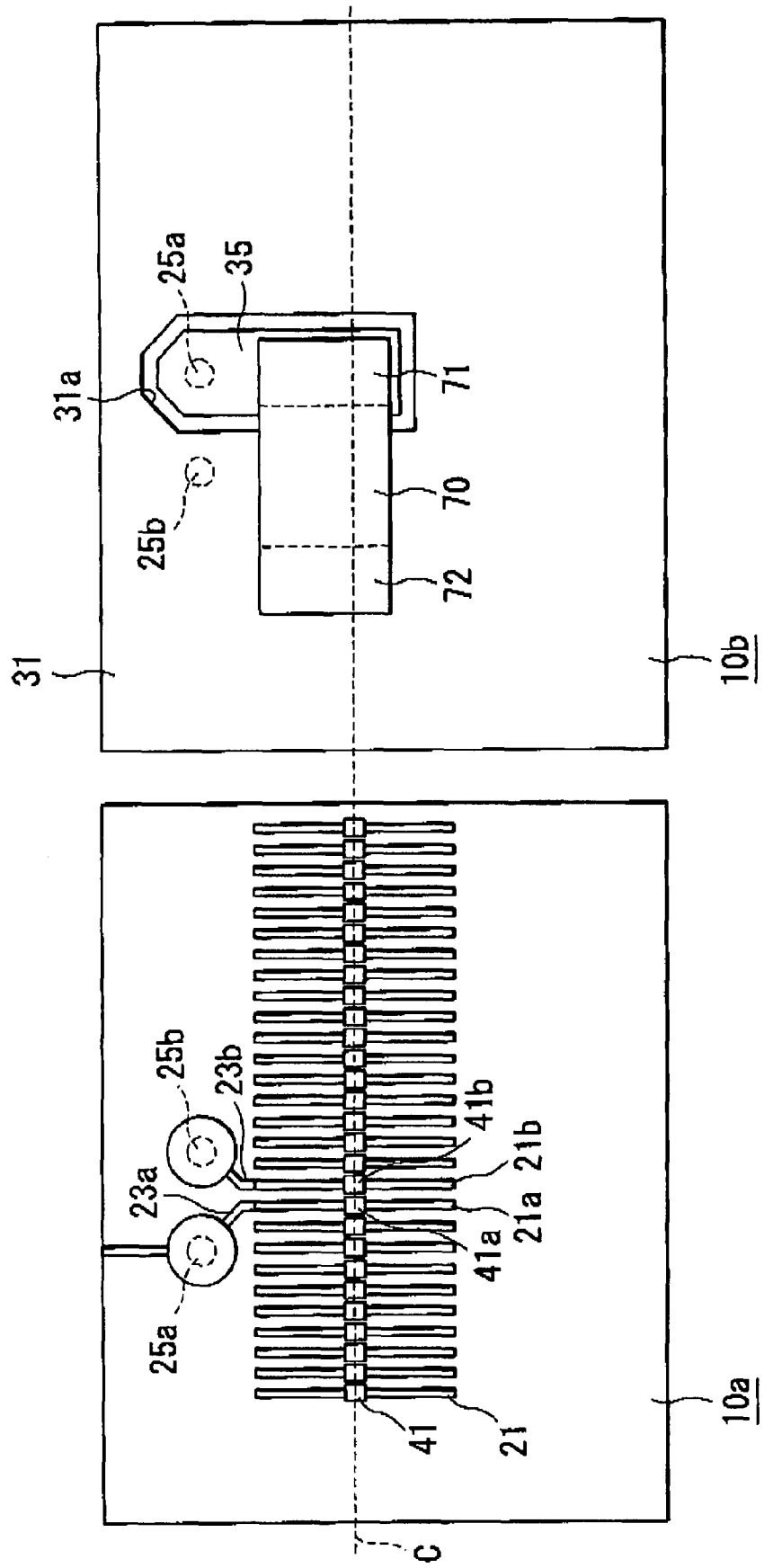
FIG. 4 is a set of partial, enlarged views showing upper and lower surfaces of a substrate of FIG. 1.

With reference to FIGS. 1, 3 and 4, a plurality of bond leads 21 are formed within a center area of the upper surface 10a of the substrate 10. As best shown in FIG. 4, the bond leads 21 are arranged in parallel in a direction along a center line C of the semiconductor chip 40. As shown in FIGS. 3 and 4, the bond leads 21 includes first bond leads 21a and second bond leads 21b; each of the first bond leads 21a is to be supplied with a power supply, while each of the second bond leads 21b is to be grounded.

Each of the bond leads 21 is electrically extended to the lower surface 10b via through holes 25 and traces 23. Especially, each of the first bond leads 21a is electrically extended to the lower surface 10b through a trace 23a and through holes 25a and 25c, as shown in FIG. 3. Likewise, each of the second bond leads 21b is electrically extended to the lower surface 10a through a trace 23b and a through hole 25b.

With reference to FIGS. 1, 3 and 4, the lower surface 10b is generally covered by a ground plane electrode 31. As best shown in FIG. 3, the ground plane electrode 31 constitutes a plurality of ball lands 33b, each of which is electrically connected to the second bond lead 21b through a part of the ground plane electrode 31, the through hole 25b and the trace 23b.

As shown in FIGS. 3 and 4, the ground plane electrode 31 is formed with windows 31a and openings 31b. Within each window 31a, a conductive island 35 is formed to be separated from the ground plane electrode 31; each window 31a and each conductive island 35 are very smaller than the ground plane electrode 31 so that the function of the ground plane electrode does not degraded. Within each opening 31b, a ball land 33 is formed to be separated from the ground plane electrode 31. The conductive island 35 is electrically connected to the first bond lead 21a through the through hole 25a and the trace 23a. Likewise, the ball land 33a is electrically connected to the first bond lead 21 through the through hole 25c and the trance 23a.

As shown in FIG. 1, a semiconductor chip 40 is mounted on the surface 10a. The semiconductor chip 40 of the present embodiment is a memory chip, especially a dynamic random access memory (DRAM) chip. The semiconductor chip 40 has a center area and a peripheral area; on the center area of the semiconductor chip 40, a plurality of pads 41 are arranged. As best shown in FIG. 4, the pads 41 are arranged on the center line C of the semiconductor chip 40 in this embodiment. As shown in FIG. 1, the pads 41 are connected to the bond leads 21 through flip chip bumps 50, respectively. In detail, as shown in FIGS. 3 and 4, the pads 41 include first pads 41a to be supplied with a power supply and second pads 41b to be grounded. Each of the first pads 41a is connected to a corresponding one of the first bond leads 21a, while each of the second pads 41b is connected to a corresponding one of the second bond leads 21b.

Figure 2:
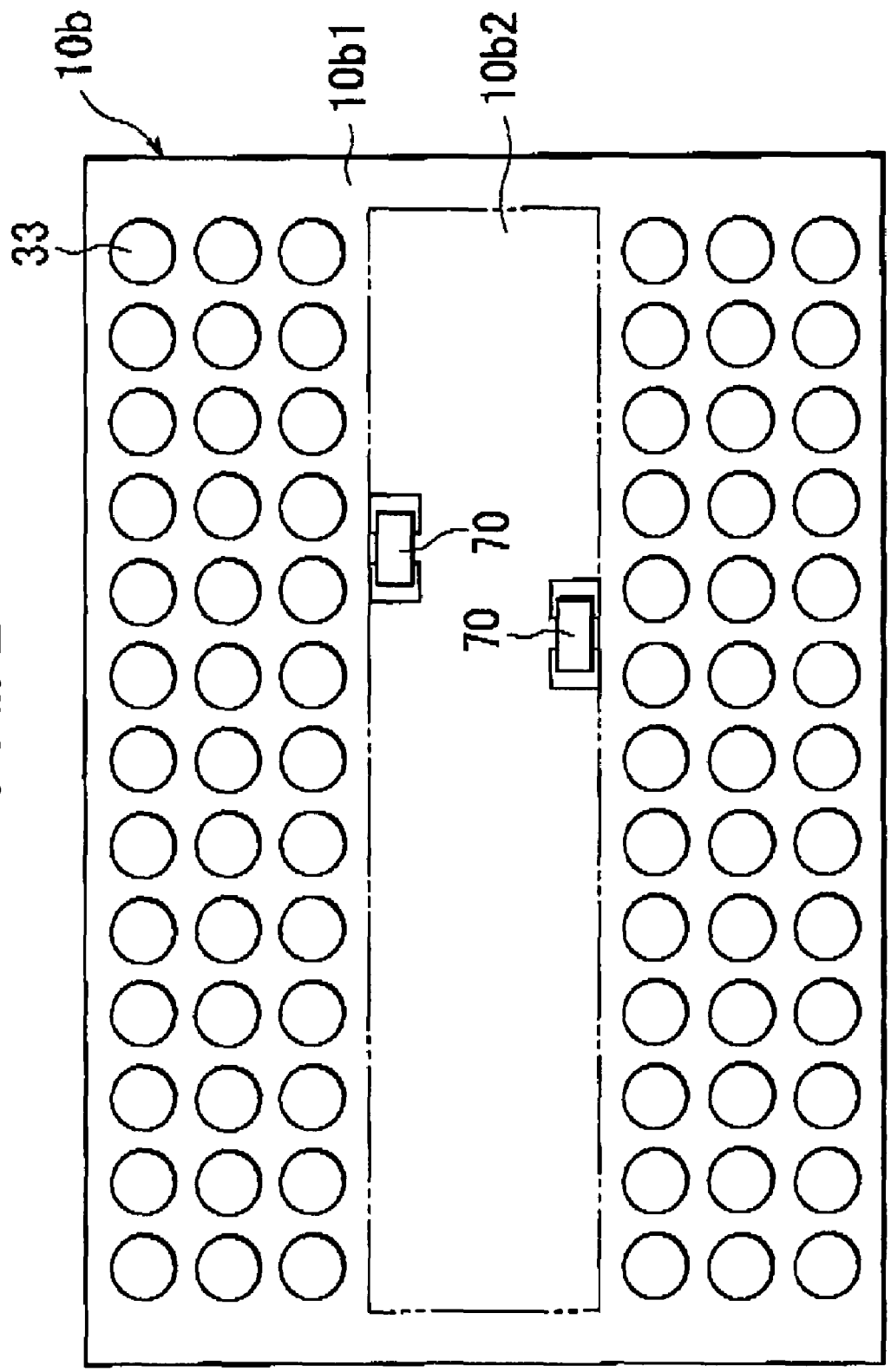
FIG. 2 is a view showing two areas, on one of which a plurality of ball lands are arranged; on the other area, chip capacitors are arranged.

With reference to FIG. 2, the lower surface 10b has a first lower area 10b1 and a second lower area 10b2. As apparent from FIGS. 2 to 4, the windows 31a and the conductive islands 35 are formed only on the second lower area 10b2 in this embodiment. On the other hand, the openings 31b and ball lands 33 including the ball lands 33a, 33b are formed only on the first lower area 10b1 in this embodiment. On the ball lands 33, solder balls 60 are disposed, respectively, as shown in FIG. 1.

As shown in FIGS. 1 to 4, a plurality of bypass capacitors 70 are disposed on the second lower area 10b2. In the drawings, only one or two bypass capacitors 70 are shown for the sake of better understanding, but the present invention is not limited thereto. In this embodiment, each bypass capacitor is a chip capacitor and has two terminals 71, 72, as shown in FIGS. 3 and 4; the terminal 71 is coupled to the conductive island 35, while the other terminal 72 is connected to the ground plane electrode 31, as shown in FIGS. 3 and 4. Thus, the terminal 71 is coupled to the first pad 41a of the semiconductor chip 40 through an electrical path comprised of the conductive island 35, the through hole 25a, the trace 23a and the first bond lead 21a. Likewise, the terminal 72 is coupled to the second pad 41b of the semiconductor chip 40 through another electrical path comprised of the ground plane electrode 31, the through hole 25b, the trace 23b and the second bond lead 21b. As apparent from FIGS. 2 to 4, the bond leads 21 coupled to the pads 41 are arranged within an area corresponding to the second lower area 10b2 so that the electrical paths between the first and the second pads 41a, 41b and the terminals 71, 72 can be made short.

In the above-described embodiment, one pair of the through holes 25a, 25b is positioned on the same side with respect to the center line C, as shown in the left view of FIG. 4. In addition, each bypass capacitor 70 is arranged so that it has a longitudinal direction parallel to the center line C, as shown in the right view of FIG. 4. However, the present invention is not limited thereto. For example, the through holes 25a, 25b constituting one pair are positioned on the different sides with respect to the center line C, as shown in the left view of FIG. 5. In addition, each bypass capacitor 70 is arranged so that it has a longitudinal direction perpendicular to the center line C, as shown in the right view of FIG. 5.

Figure 5:
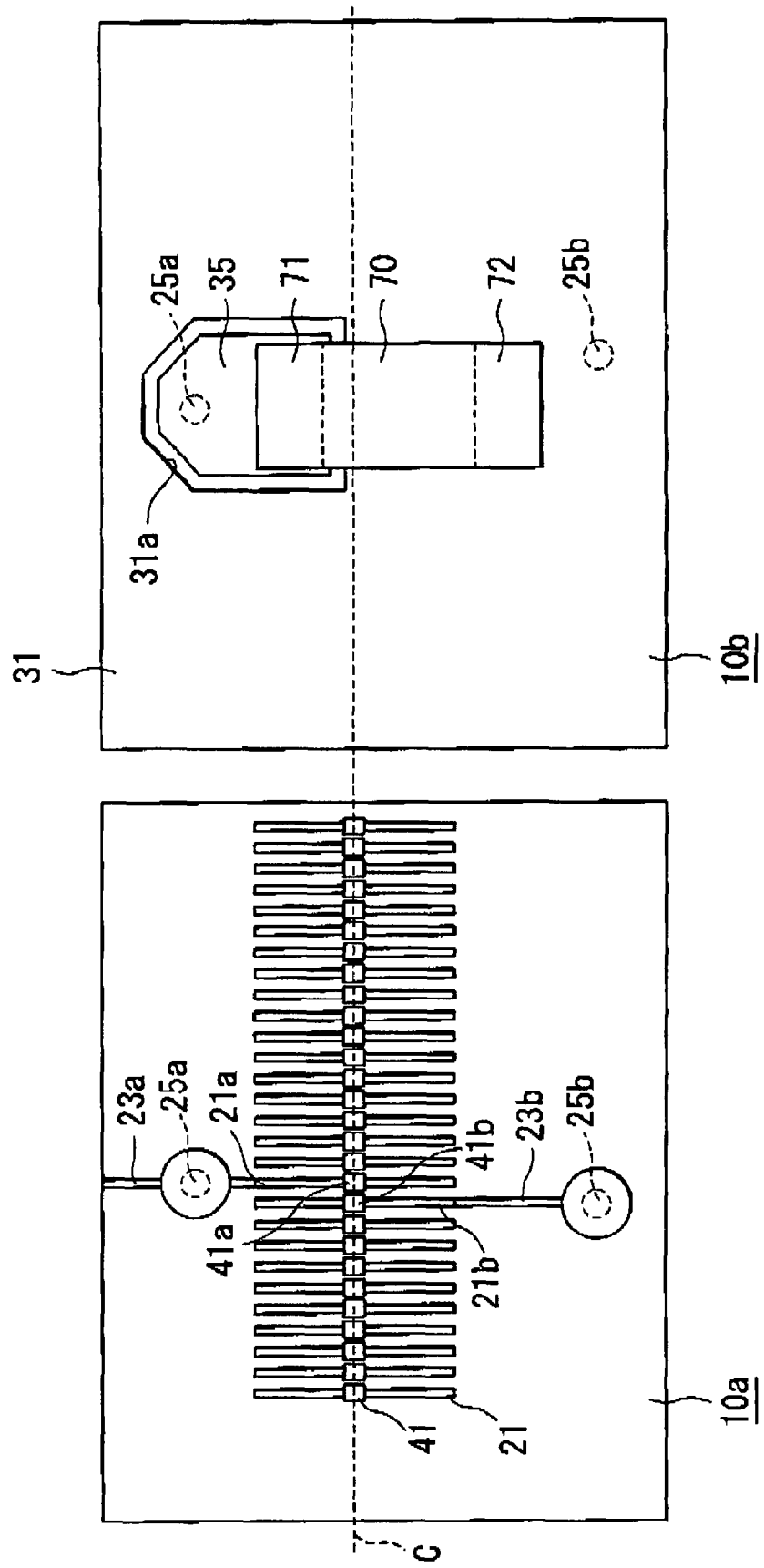
FIG. 5 is a set of partial, enlarged views concerning a modification of the substrate of FIG. 4.
Figure 6:
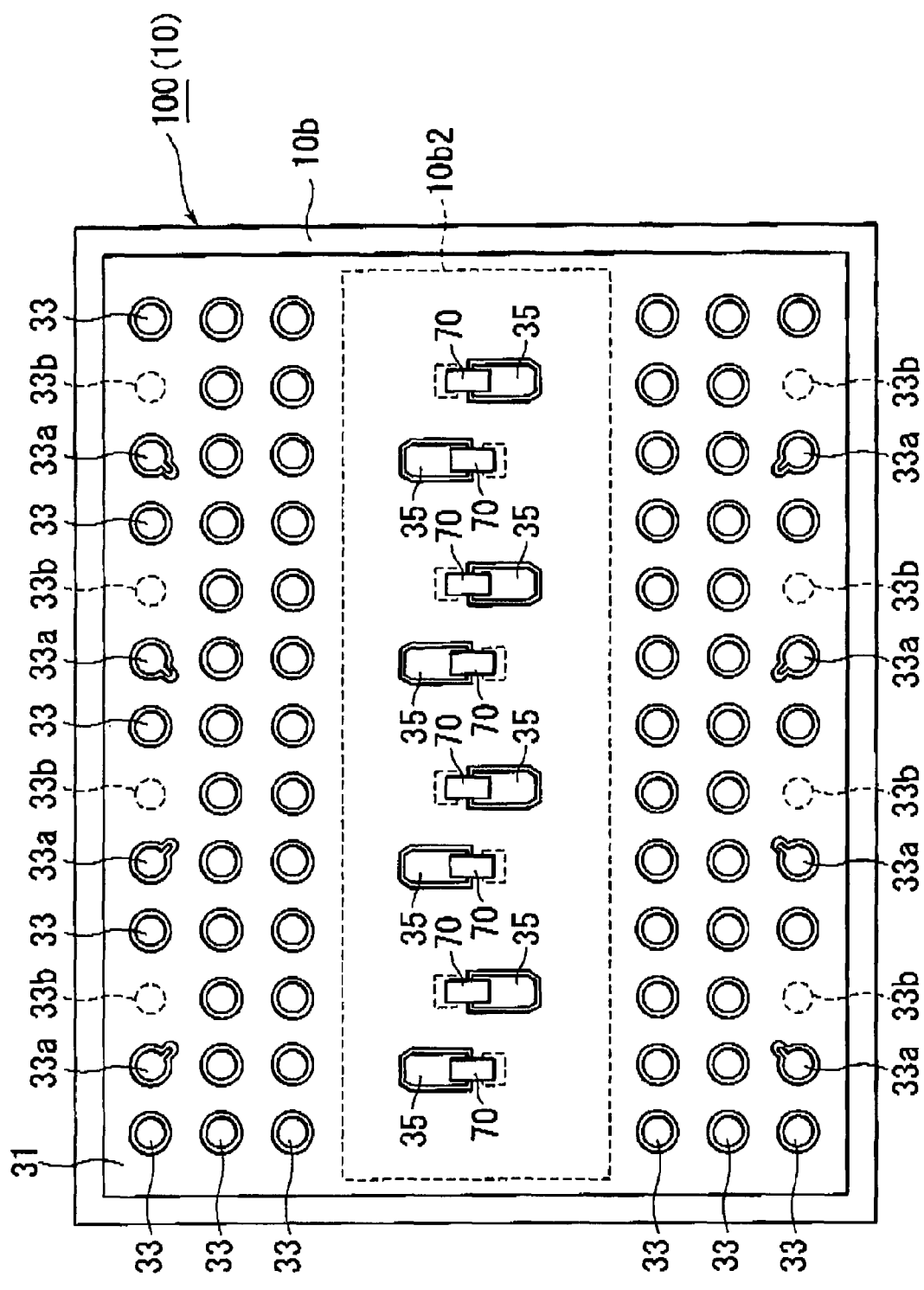
FIG. 6 is a bottom view schematically showing the substrate of FIG. 5, on which eight chip capacitors are arranged.

With reference to FIG. 6, there is shown a concrete example of the semiconductor package 100 in accordance with the arrangement of FIG. 5. In this example, the semiconductor package 100 comprises eight bypass capacitors 70 as well as eight conductive islands 35. Larger number of the bypass capacitors 70 can provide larger capacitance and, accordingly, higher decoupling effect. On the other hand, larger area size of the ground plane electrode 31 can provide more stable, superior signal transmission characteristics. In this connection, it is preferable that the conductive islands 35 have a total area less than 15% of the second lower area 10b2.

In the above-mentioned embodiment, the terminal 72 of the bypass capacitor 70 is electrically connected to the ground plane electrode 31. In order to accommodate multiple pairs of power supply voltages and ground voltages, ex, VDD and VSS as well as VDDQ and VSSQ, the second lower area 10b of the lower surface 10b is provided with conductive islands for ground voltages.

Figure 7:
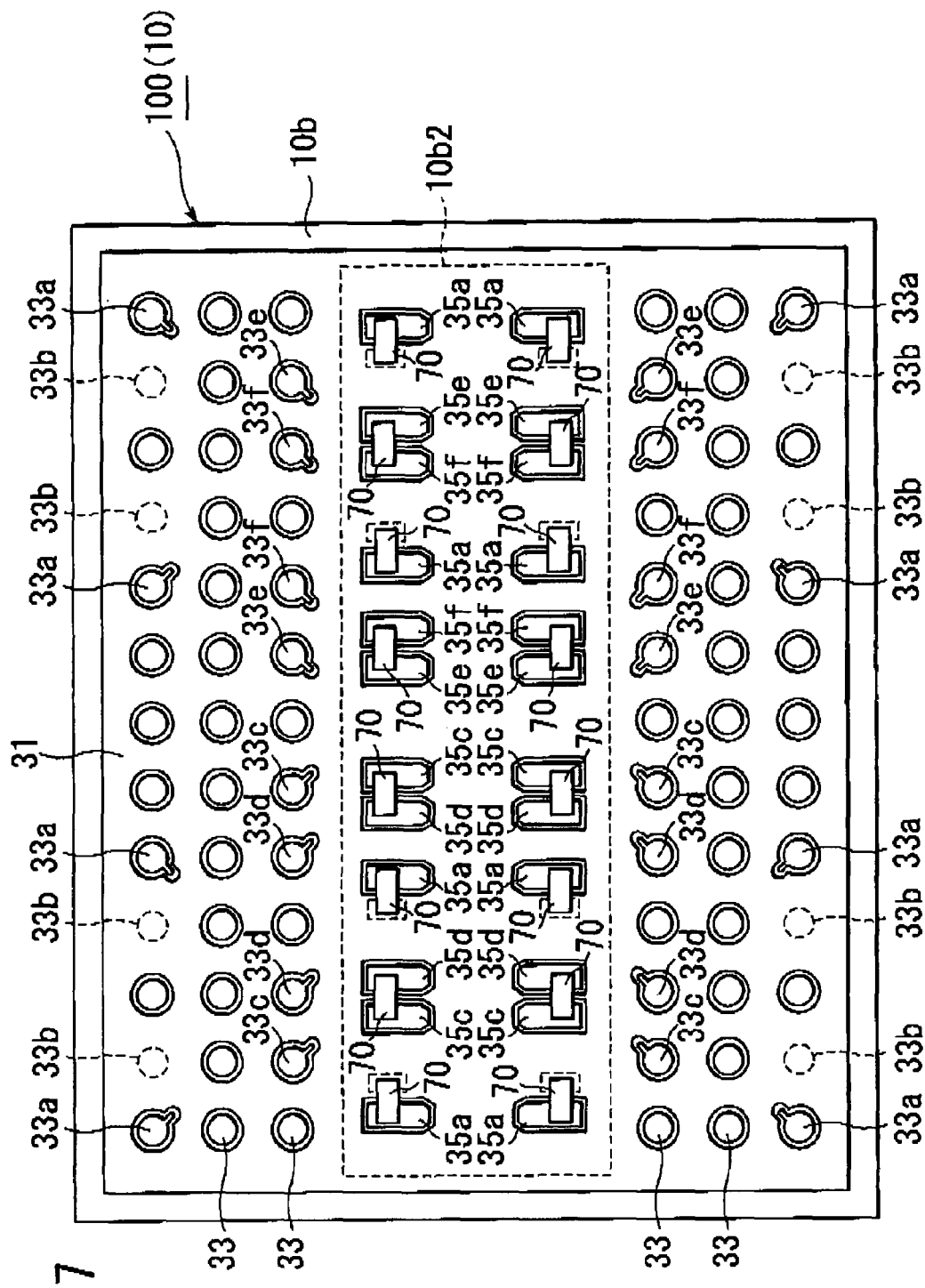
FIG. 7 is a bottom view schematically a modification of the substrate of FIG. 6.

With reference to FIG. 7, the semiconductor package 100 comprises sixteen bypass capacitors 70 and accommodates three pairs of power supply voltages and ground voltages. In detail, the substrate 10 is provided with three kinds of conductive islands 35a, 35c, 35e for the respective power supply voltages and two kinds of conductive islands 35d, 35f for the respective ground voltages. All of the conductive islands 35a, 35c, 35d, 35e, 35f are respectively positioned within windows formed in the ground plane electrode 31 and are separated from the ground plane electrode 31. Among them, the conductive islands 35c, 35d constitute pairs; each of the conductive islands 35c is electrically connected to a corresponding ball land 33c, while each of the conductive islands 35d is electrically connected to a corresponding ball land 33d. Likewise, the conductive islands 35e, 35f constitute pairs; each of the conductive islands 35e is electrically connected to a corresponding ball land 33e, while each of the conductive islands 35f is electrically connected to a corresponding ball land 33f. The conductive islands 35a are same as the conductive islands 35 of FIG. 6, and each of them is electrically connected to a corresponding ball land 33a. Also in this illustration, it is preferable that the conductive islands 35a-35f have a total area less than 15% of the second lower area 10b2.

Figure 9:
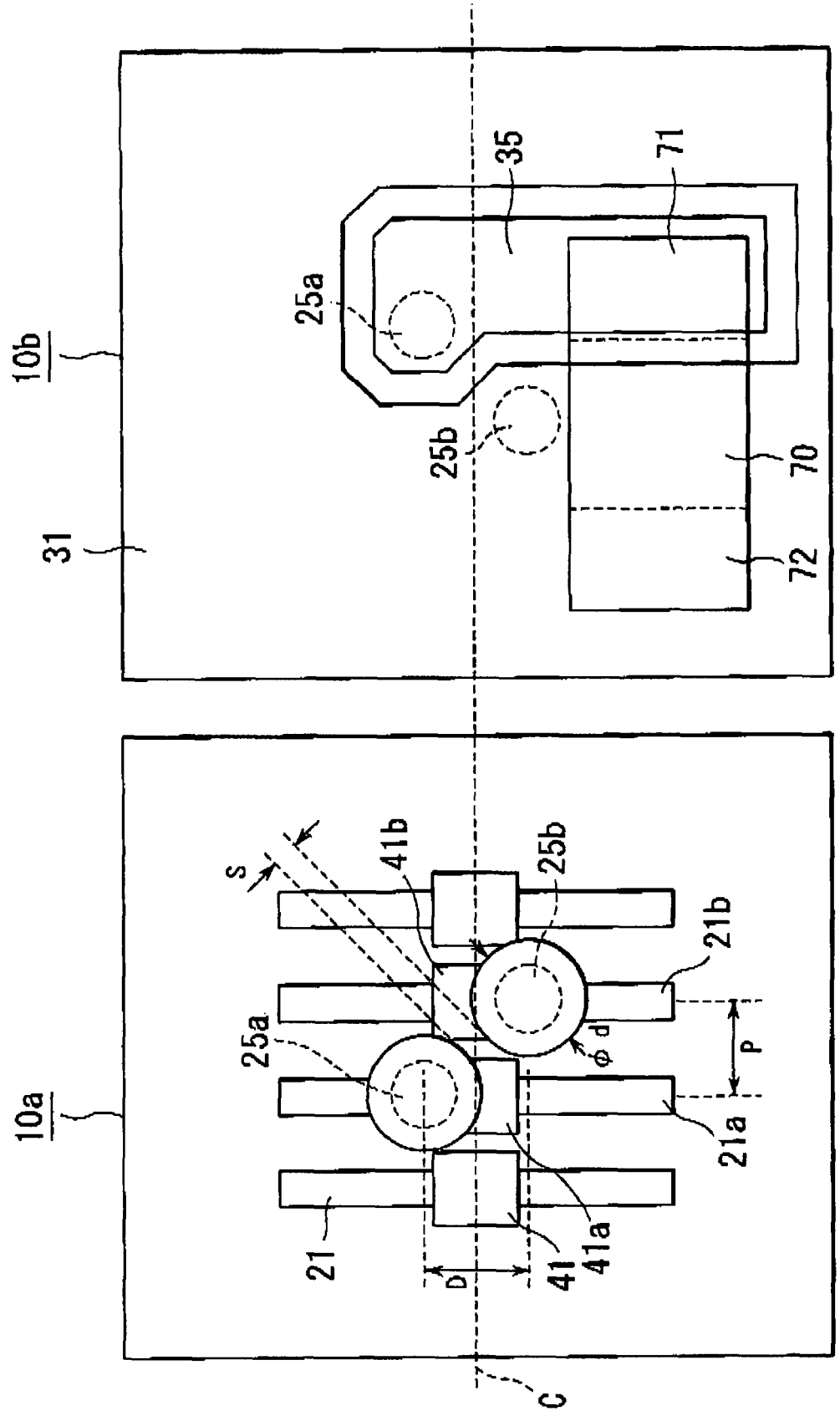
FIG. 9 is a set of partial, enlarged views concerning yet another modification of the substrate of FIG. 4.

In the above-mentioned embodiment, the through holes 25a, 25b are connected to the first and the second bond leads 21a, 21b through the traces 23a, 23b, respectively, as shown in FIG. 3. However, the present invention is not limited thereto. Depending on design rule requirement, the through holes 25a, 25b may be directly connected to the first and the second bond leads 21a, 21b, respectively, without using the traces 23a, 23b, as shown in FIG. 8 or 9. In FIGS. 8 and 9, a symbol "P" indicates a pitch between neighboring bond leads 21, i.e. neighboring pads 41; another symbol "S" indicates a pitch between neighboring through-hole pads; yet another symbol "φd" is a diameter of each through-hole pad. If a formula $[P-(\phi d+S) \geqq 0]$ is met, the through holes 25a, 25b may be formed on the center line C, as shown in FIG. 8; in other words, the through holes 25a, 25b may be formed directly below the corresponding pads 41. If a formula $[[P-(\phi d+S)<0]$ is met, the through holes 25a, 25b should be arranged apart from each other by a distance D in a direction perpendicular to the center line C, as shown in FIG. 9, where the distance D is represented by the following formula:

$$D=\sqrt{(\phi d+S)^2-P^2}$$

The present application is based on a Japanese patent application of JP2006-148474 filed before the Japan Patent Office on May 29, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A semiconductor package comprising:
   a substrate having upper and lower surfaces and comprising first and second electrical paths, the first and the second electrical paths including first and second through holes, respectively, each of the first and the second through holes electrically connecting between the upper and the lower surfaces of the substrate;

a semiconductor chip mounted on the upper surface and comprising a plurality of pads, the pads including a first pad to be supplied with a power supply and a second pad to be grounded; and at least one bypass capacitor mounted on the lower surface and comprising first and second terminals, the first and the second terminals being connected to the first and the second pads through the first and the second electrical paths, respectively.

at least one first land formed on said lower surface of said substrate to supply a first power voltage to said first pad; and at least one second land formed on said lower surface of said substrate to supply a second power voltage to said second pad.

2. The semiconductor package according to claim 1, wherein the bypass capacitor comprises a chip capacitor.

3. The semiconductor package according to claim 1, wherein:

the semiconductor chip comprises a surface which has a center area and a peripheral area; and the pads are arranged only on the center area.

4. The semiconductor package according to claim 1, wherein the substrate is a two metal layer substrate and comprises a flexible polyimide tape as a base member.

5. The semiconductor package according to claim 1, wherein the semiconductor chip is a semiconductor memory chip.

6. The semiconductor package according to claim 1, wherein said first and second through holes are arranged closer corresponding pads of said plurality of pads in the first and second electrical path than said first land and said second land.

7. A semiconductor package comprising:

a substrate having upper and lower surfaces and comprising first and second electrical paths, the first and the second electrical paths including first and second through holes, respectively, each of the first and the second through holes electrically connecting between the upper and the lower surfaces of the substrate;

a semiconductor chip mounted on the upper surface and comprising a plurality of pads, the pads including a first pad to be supplied with a power supply and a second pad to be grounded; and at least one bypass capacitor mounted on the lower surface and comprising first and second terminals, the first and the second terminals being connected to the first and the second pads through the first and the second electrical paths, respectively, wherein:

the substrate is provided with a plurality of ball lands;

the lower surface comprises a first lower area and a second lower area;

the ball lands are arranged on the first lower area;

the bypass capacitor is mounted on the second lower area;

the upper surface of the substrate comprises a first upper area and a second upper area, the first upper area and the second upper area corresponding to the first lower area and the second lower area, respectively;

the substrate is further provided with a plurality of bond leads and at least one conductive island;

the bond leads are arranged on the second upper area and are connected to the pads, respectively;

the bond leads include first and second bond leads corresponding to the first and the second pads, respectively;

the conductive island is formed on the second lower area and is connected to the first through hole;

the first terminal of the bypass capacitor is mounted on and connected to the conductive island;

the first electrical path is formed, in part, of the conductive island and the first bond lead; and the second electrical path is formed, in part, of the second bond.

8. The semiconductor package according to claim 7, wherein:

the substrate is further provided with a ground plane electrode;

the ground plane electrode is formed on the lower surface and is connected to the second through hole;

the ground plane electrode is formed with a window which is positioned on the second lower area;

the conductive island is positioned in the window and is separated from the ground plane electrode; and the second terminal of the bypass capacitor is mounted on and connected to the ground plane electrode.

9. The semiconductor package according to claim 7, wherein the conductive island is one or more in number and has a total area less than 15% of the second lower area.

10. The semiconductor package according to claim 7, wherein:

the substrate is further provided with an additional conductive island;

the additional conductive island is formed on the second lower area and is connected to the second through hole; and the second terminal of the bypass capacitor is mounted on and connected to the additional conductive island.

11. The semiconductor package according to claim 10, wherein:

the substrate is further provided with a ground plane electrode;

the ground plane electrode is formed on the lower surface and is formed with first and second windows both of which are positioned on the second lower area; and the conductive island and the additional conductive islands are positioned in the first and the second windows, respectively, and are separated from the ground plane electrode.

12. The semiconductor package according to claim 10, wherein the conductive island is one or more in number; the additional conductive island is one or more in number; and the conductive island and the additional conductive island have a total area less than 15% of the second lower area.

13. The semiconductor package according to claim 7, wherein:

the substrate is further provided with first and second conductive traces;

the first and the second conductive traces are formed on the upper surface;

the first conductive trace is connected to the first bond lead and to the first through hole and constitutes a part of the first electrical path; and the second conductive trace is connected to the second bond lead and to the second through hole and constitutes a part of the second electrical path.

14. The semiconductor package according to claim 7, wherein the first and the second bond leads are directly connected to the first and the second through holes, respectively.

15. The semiconductor package according to claim 7, wherein:
  the bond leads are arranged in a predetermined direction; and
  the bypass capacitor has a longitudinal direction parallel to the predetermined direction.

16. The semiconductor package according to claim 7, wherein:
  the bond leads are arranged in a predetermined direction; and
  the bypass capacitor has a longitudinal direction perpendicular to the predetermined direction.

17. The semiconductor package according to claim 7, further comprising a plurality of flip chip bumps, which connect between the pads of the semiconductor chip and the bond leads of the substrate, respectively.

* * * * *